(12) United States Patent
Jeong et al.

(10) Patent No.: US 9,448,348 B2
(45) Date of Patent: Sep. 20, 2016

(54) WIRE GRID POLARIZER AND ORGANIC LIGHT-EMITTING DISPLAY APPARATUS INCLUDING THE SAME

(71) Applicant: SAMSUNG DISPLAY CO., LTD., Yongin, Gyeonggi-Do (KR)

(72) Inventors: Chang-Yong Jeong, Yongin (KR); Mu-Gyeom Kim, Yongin (KR); Seong-Min Wang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/156,421

(22) Filed: Jan. 15, 2014

(65) Prior Publication Data

US 2015/0028296 A1 Jan. 29, 2015

(30) Foreign Application Priority Data

Jul. 23, 2013 (KR) .......................... 10-2013-0086985

(51) Int. Cl.
*G02B 5/30* (2006.01)
*H01L 51/52* (2006.01)
*G02B 1/116* (2015.01)

(52) U.S. Cl.
CPC .......... *G02B 5/3058* (2013.01); *H01L 51/5281* (2013.01); *G02B 1/116* (2013.01)

(58) Field of Classification Search
CPC ..................... H01L 51/5293; G02B 5/3058
USPC .......................................................... 257/40
See application file for complete search history.

(56) References Cited

U.S. PATENT DOCUMENTS

| | | | |
|---|---|---|---|
| 6,987,547 B2 * | 1/2006 | Yang ................. | G02F 1/133603 349/61 |
| 7,639,414 B2 | 12/2009 | Hwang et al. | |
| 8,013,807 B2 | 9/2011 | Cha et al. | |
| 8,873,144 B2 * | 10/2014 | Davis ................. | G02B 5/3058 359/485.05 |
| 2005/0146720 A1 * | 7/2005 | Hansen ............... | G02B 27/288 356/370 |
| 2005/0206828 A1 * | 9/2005 | Lee ..................... | H01L 27/3276 349/149 |
| 2007/0242352 A1 | 10/2007 | MacMaster | |
| 2008/0316599 A1 * | 12/2008 | Wang .................. | G02B 5/3058 359/485.05 |
| 2012/0250154 A1 * | 10/2012 | Davis .................. | B82Y 20/00 359/485.05 |
| 2013/0043956 A1 * | 2/2013 | Salit ................... | G02B 5/3058 331/94.1 |
| 2013/0077164 A1 * | 3/2013 | Davis .................. | G02B 5/3058 359/485.05 |

FOREIGN PATENT DOCUMENTS

| | | |
|---|---|---|
| KR | 10-2007-0101814 | 10/2007 |
| KR | 10-2008-0079857 | 9/2008 |
| KR | 10-2009-0011916 | 2/2009 |

* cited by examiner

*Primary Examiner* — Mohammad Islam
*Assistant Examiner* — Christina Sylvia
(74) *Attorney, Agent, or Firm* — Lewis Roca Rothgerber Christie LLP

(57) ABSTRACT

An organic light-emitting display includes a display unit configured to generate an image and a wire grid polarizer on the display unit; the wire grid polarizer includes a base substrate and a plurality of wire grids formed on the base substrate, wherein the plurality of wire grids are spaced from one another and disposed in parallel, and a first spacing between each pair of the plurality of wire grids in a first region of the base substrate and a second spacing between each pair of the plurality of wire grids in a second region of the base substrate is different.

19 Claims, 5 Drawing Sheets

WIRE GRID POLARIZER AND ORGANIC LIGHT-EMITTING DISPLAY APPARATUS INCLUDING THE SAME

CROSS-REFERENCE TO RELATED APPLICATION

This application claims priority to and the benefit of Korean Patent Application No. 10-2013-0086985, filed on Jul. 23, 2013, in the Korean Intellectual Property Office, the disclosure of which is incorporated herein in its entirety by reference.

BACKGROUND

1. Field

The following description relates to a wire grid polarizer and an organic light-emitting display apparatus including the same.

2. Description of the Related Art

Recently, traditional display apparatuses have tended to be replaced by portable, thin flat-panel display apparatuses. Among the flat-panel display apparatuses, an electroluminescent display apparatus, which is a self-light-emitting display apparatus, has received much attention as an advanced display device due to its wide viewing angles and fast response speeds. Also, in comparison to an inorganic light-emitting display apparatus, an organic light-emitting display apparatus, in which an emission layer is formed of an organic material, may have enhanced characteristics, such as higher brightness, lower driving voltage, and faster response speeds and may provide multi-color images.

However, with respect to the organic light-emitting display apparatus, a phenomenon of having (e.g., displaying) a higher brightness in a region near an interconnection unit that applies power to an organic light-emitting device may occur. Also, a color change phenomenon may occur, in which a displayed color may appear to be different to a user according to a viewing angle of the user looking at the organic light-emitting display apparatus.

SUMMARY

Aspects of one or more embodiments of the present invention are directed toward a wire grid polarizer that may improve the uniformity of brightness and may reduce a color change phenomenon according to viewing angle, and an organic light-emitting display apparatus including the same.

Additional aspects and/or characteristics will be set forth in part in the description which follows and, in part, will be apparent from the description, or may be learned by practice of the present invention.

According to an embodiment of the present invention, a wire grid polarizer includes a base substrate and a plurality of wire grids formed on the base substrate, wherein the plurality of wire grids may be spaced from one another and disposed in parallel, and a first spacing between each pair of the plurality of wire grids in a first region of the base substrate and a second spacing between each pair of the plurality of wire grids in a second region of the base substrate may be different.

The first region may be outside the second region, and the first spacing may be larger than the second spacing.

All of the plurality of wire grids may have a same width, and a first pitch of the plurality of wire grids in the first region may be larger than a second pitch of the plurality of wire grids in the second region.

All of the plurality of wire grids may have a same pitch, and a width of each of the plurality of wire grids in the first region may be smaller than a width of each of the plurality of wire grids in the second region.

A spacing between the plurality of wire grids may increase along a direction from the second region to the first region.

An anti-reflective layer may be formed on a surface of each of the plurality of wire grids.

The surface may be a side on which external light is incident.

The anti-reflective layer may include a dielectric material and a metal.

According to another embodiment of the present invention, an organic light-emitting display apparatus includes a display unit configured to generate an image and a wire grid polarizer on the display unit, wherein the wire grid polarizer includes a base substrate and a plurality of wire grids formed on the base substrate, wherein the plurality of wire grids may be spaced from one another and disposed in parallel, and a first spacing between each pair of the plurality of wire grids in a first region of the base substrate and a second spacing between each pair of the plurality of wire grids in a second region of the base substrate may be different.

The display unit may include an organic light-emitting device configured to generate the image and a plurality of interconnections configured to supply a drive signal and power to the organic light-emitting device, wherein the interconnections may extend parallel to the plurality of wire grids and the plurality of wire grids may not overlap with the interconnections.

A power supply line of the interconnections may be nearer to the first region than the second region.

The display unit is configured to display a higher brightness at a portion of the display unit corresponding to the first region than at a portion of the display unit corresponding to the second region.

The first region may be outside the second region, and the first spacing may be larger than the second spacing.

Each of the plurality of wire grids may have a same width, and a first pitch of the plurality of wire grids in the first region may be larger than a second pitch of the plurality of wire grids in the second region.

All of the plurality of wire grids may have a same pitch, and a width of each of the plurality of wire grids in the first region may be smaller than a width of each of the plurality of wire grids in the second region.

A spacing between the plurality of wire grids may increase along a direction from the second region to the first region.

An anti-reflective layer may be formed on a surface of each of the plurality of wire grids.

The surface may be a side on which external light is incident.

The anti-reflective layer may include a dielectric material and a metal.

The display unit may further include a transistor configured to apply an electrical signal to the organic light-emitting device.

BRIEF DESCRIPTION OF THE DRAWINGS

These and/or other aspects will become apparent and more readily appreciated from the following description of embodiments, taken in conjunction with the accompanying drawings of which.

DETAILED DESCRIPTION

Figure 1:
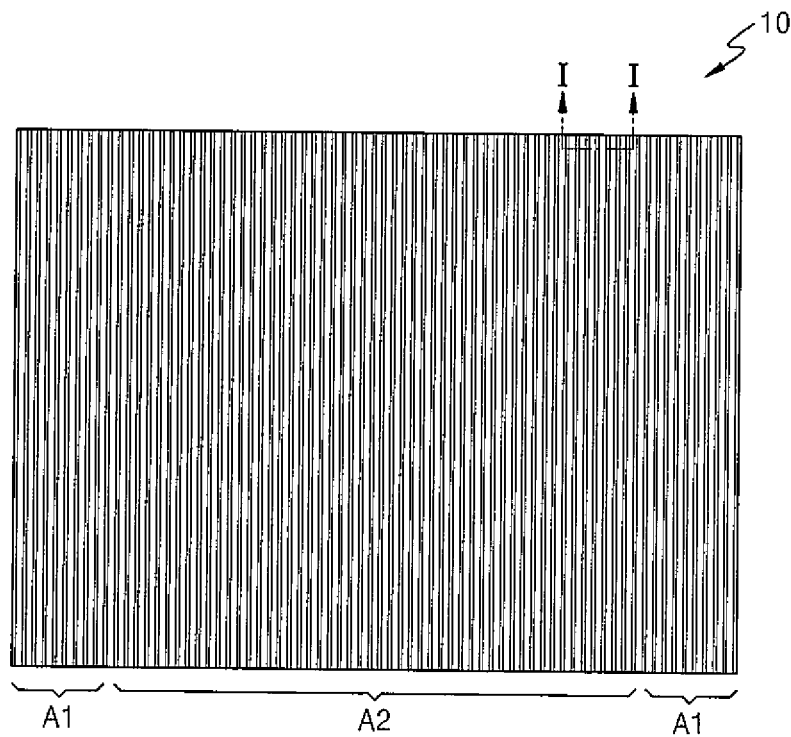
FIG. 1 is a plan view schematically illustrating a wire grid polarizer according to an embodiment of the present invention.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

While the invention is amenable to various modifications and alternative forms, specific embodiments have been shown by way of example in the drawings and are described in detail below. The intention, however, is not to limit the invention to the particular embodiments described. On the contrary, the invention is intended to cover all modifications, equivalents, and alternatives falling within the scope of the invention as defined by the appended claims. Moreover, detailed descriptions related to well-known functions or configurations will be omitted in order to avoid unnecessarily obscuring subject matter of the present invention.

It will be understood that although the terms "first", "second" etc. may be used herein to describe various components, these components should not be limited by these terms. These terms are only used to distinguish one component from another.

The terminology used herein is for the purpose of describing particular example embodiments only and is not intended to be limiting of the present invention. As used herein, the singular forms "a", "an", and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

Hereinafter, embodiments of the present invention will be described in detail with reference to the attached drawings.

Figure 2:
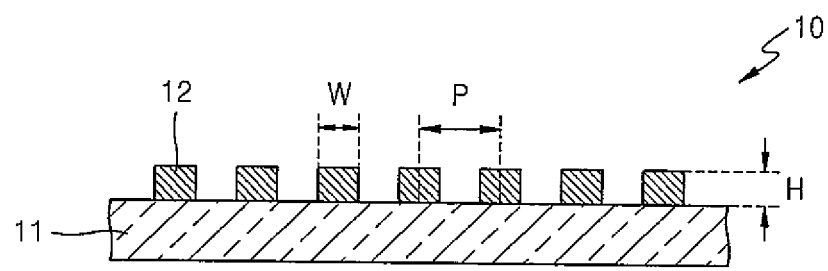
FIG. 2 is a cross-sectional view schematically illustrating a cross section taken along line I-I of the wire grid polarizer shown in FIG. 1.
Figure 3:
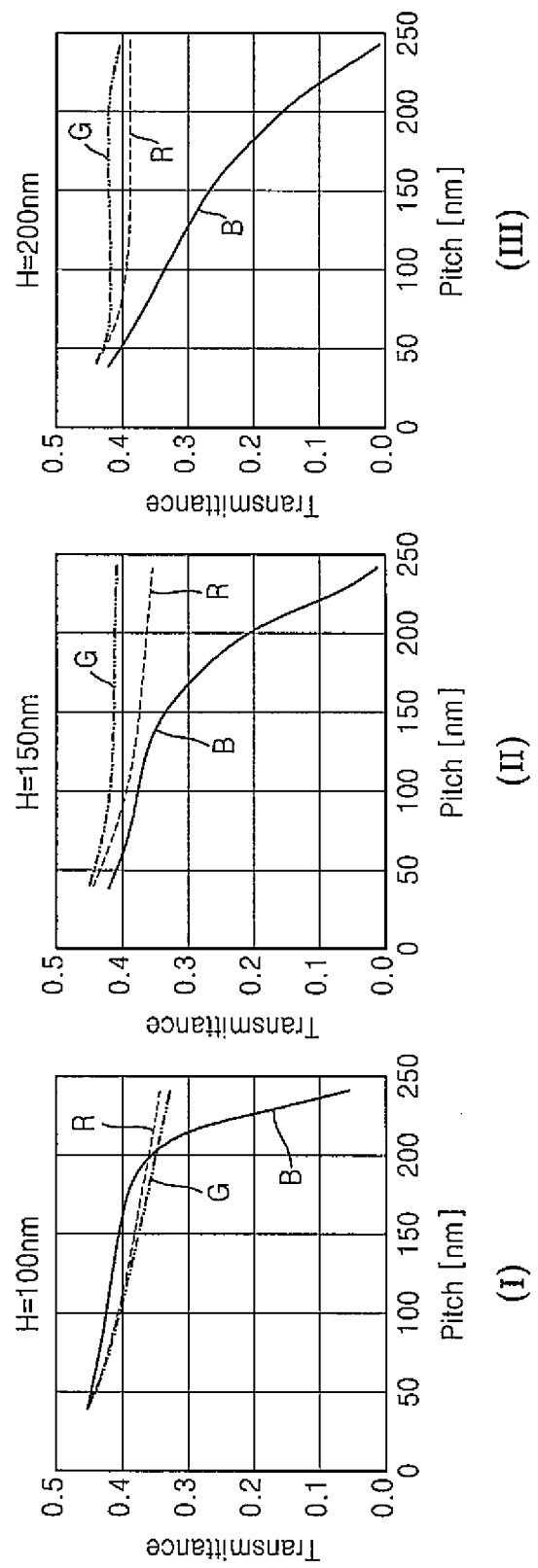
FIG. 3 schematically illustrates optical properties of the wire grid polarizer of FIG. 1 according to a grid height.
Figure 4:
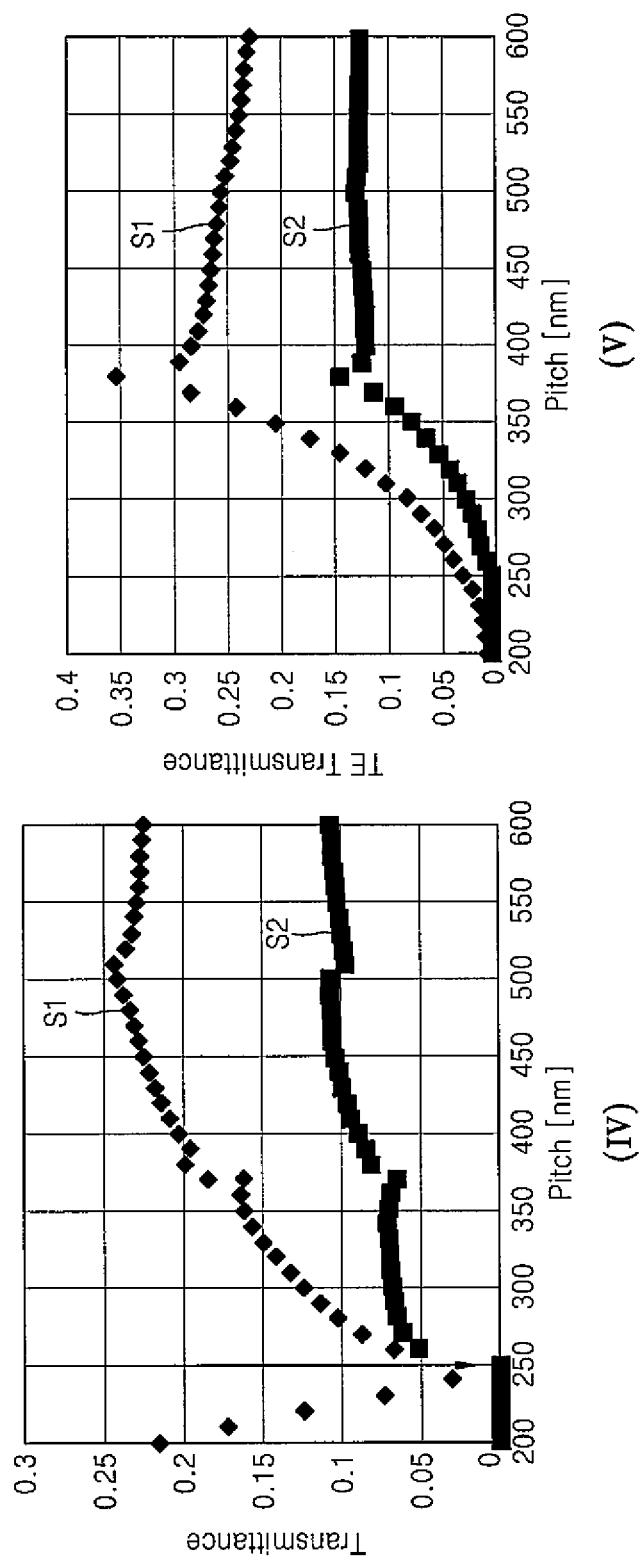
FIG. 4 schematically illustrates optical properties of the wire grid polarizer of FIG. 1 according to a grid pitch.

FIG. 1 is a plan view schematically illustrating a wire grid polarizer 10 according to an embodiment of the present invention, FIG. 2 is a cross-sectional view schematically illustrating a cross section taken along line I-I of the wire grid polarizer shown in FIG. 1, FIG. 3 schematically illustrates optical properties of the wire grid polarizer 10 shown in FIG. 1 according to a grid height, and FIG. 4 schematically illustrates optical properties of the wire grid polarizer 10 shown in FIG. 1 according to a grid pitch.

Referring to FIGS. 1 to 4, the wire grid polarizer 10 according to an embodiment of the present invention may include a base substrate 11 and a plurality of wire grids 12 formed on the base substrate 11.

The base substrate 11 may be formed of a transparent material so that light emitted from an organic light-emitting device (see 100b of FIG. 6) may transmit therethrough. For example, the base substrate 11 may be formed of glass or a plastic material having light transparency. Examples of the plastic material may include poly(methyl methacrylate) (PMMA), polycarbonate (PC), polystyrene (PS), and polyethylene terephthalate (PET). However, the plastic material is not limited thereto.

The plurality of wire grids 12 may be disposed parallel (e.g., arranged parallel) to one another on the base substrate 11, and may be formed along one direction (e.g., formed to extend along one direction) of the base substrate 11. Also, because the plurality of wire grids 12 are disposed to be spaced (e.g., spaced apart) from one another, only specific polarized light among electromagnetic waves (e.g., visible light) may be transmitted therethrough.

The wire grid 12 may be formed of a conductive material. For example, the wire grid 12 may be formed of aluminum (Al), silver (Ag), chromium (Cr), nickel (Ni), cobalt (Co), or molybdenum (Mo). However, the material of the wire grid 12 is not limited thereto.

The wire grid 12 may be formed to have a height H that is less than about 200 nm. FIG. 3 illustrates optical transmittance of the wire grid polarizer 10 according to the height H of the wire grid 12.

FIGS. 3 (I), (II), and (III) respectively illustrate optical transmittance of the wire grid polarizer 10 according to a pitch of the plurality of wire grids 12 and a wavelength of incident light in a case where the height H of the wire grid 12 is about 100 nm, about 150 nm, and about 200 nm. Herein, R of FIG. 3 denotes light having a wavelength of about 750 nm (e.g., red-colored light), G denotes light having a wavelength of about 550 nm (e.g., green-colored light), and B denotes light having a wavelength of about 380 nm (e.g., blue-colored light).

Referring to FIG. 3, it may be realized that the transmittance of B having a shorter wavelength is more significantly decreased than transmittances of R and G as the height H of the wire grid 12 increases. In particular, in the case where the height H of the wire grid 12 is about 200 nm, it was found that the transmittance of B decreased to about 5% or more with respect to the transmittances of R and G. Therefore, the height H of the wire grid 12 may be less than about 200 nm. For example, the height H of the wire grid 12 may be in a range from about 100 nm or more to less than about 200 nm.

A pitch P of the wire grids 12 is a main factor for determining the performance of the wire grid polarizer 10. When the pitch P of the wire grids 12 is greater than the wavelength of the incident light, the wire grid 12 may mainly perform a diffraction grating function instead of a polarization function. In contrast, when the pitch P of the wire grids 12 is less than the wavelength of the incident light, the wire grid 12 may mainly perform the polarization function.

FIG. 4 illustrates optical properties of the wire grid polarizer 10 according to the pitch P of the wire grid 12. FIG. 4 (IV) illustrates optical transmittance according to the pitch P of the wire grid 12, and FIG. 4 (V) illustrates transverse electric transmittance (TE transmittance) according to the pitch P of the wire grid 12. Also, in FIGS. 4 (IV) and (V), S1 denotes straight light and S2 denotes scattered light.

According to FIG. 4 (IV), when the pitch P of the wire grids 12 is greater than about 250 nm, it may be realized that transmittance of S2, the scattered light, increases. Because the straight light transmitting through the wire grid polarizer 10 decreases when the scattered light increases, the brightness of an organic light-emitting display apparatus (see 100 of FIG. 5) including the wire grid polarizer 10 may decrease. Also, in FIG. 4 (V), it may be realized that the transverse electric transmittance may increase as the pitch P increases. When the transverse electric transmittance increases, contrast may decrease. Therefore, the pitch P between the wire grids 12 may be formed to be about 250 nm or less, and an optical efficiency of the wire grid polarizer 10 may increase as the pitch P of the wire grids 12 decreases.

The organic light-emitting display apparatus (see 100 of FIG. 5), to be further described later, includes a display region (see AA of FIG. 5), in which an image is displayed, and brightness of the display region (see AA of FIG. 5) may not be uniform. For example, in the display region (see AA of FIG. 5), a brightness of an outer part (see B1 of FIG. 5) nearer to interconnections supplying power to the organic light-emitting device (see 100b of FIG. 6) may be higher than a brightness of a central part (see B2 of FIG. 5) spaced relatively far apart from the interconnections.

However, with respect to the wire grid polarizer 10 according to the embodiment of the present invention, because a first spacing between each pair of the wire grids 12 disposed in at least one first region A1 of the base substrate 11 and a second spacing between each pair of the wire grids 12 disposed in a second region A2 of the base substrate 11 are different (e.g., formed to be different), uniformity of the brightness of the organic light-emitting display apparatus (see 100 of FIG. 5) may be improved. Specifically, as described in FIG. 4, the optical efficiency of the wire grid polarizer 10 may be improved as the pitch P of the wire grids 12 decreases. A decreasing pitch P of the wire grids 12 decreases denotes that a spacing between the wire grids 12 decreases when a width W of the wire grids 12 remains the same.

Therefore, because a deviation of the brightness of the organic light-emitting display apparatus (see 100 of FIG. 5) may be reduced by forming the second spacing between each pair of the plurality of wire grids 12 corresponding to the central part (see B2 of FIG. 5) of the display region (see AA of FIG. 5) narrower than the first spacing between each pair the plurality of wire grids 12 corresponding to the outer part (see B1 of FIG. 5) of the display region (see AA of FIG. 5), the uniformity of the brightness may be improved. That is, all of the wire grids 12 may have the same width W, and a first pitch of the wire grids 12 disposed in the first region A1 may be greater (e.g., formed to be greater) than a second pitch of the wire grids 12 disposed in the second region A2.

In FIG. 1, it has been described by example that the wire grid polarizer 10 is divided into the outer first region A1 and the central second region A2, and the wire grids 12 are formed to have the first spacing in the first region A1 and the second spacing in the second region A2. However, the present invention is not limited thereto. That is, the wire grid polarizer 10 may be divided into several regions according to the brightness deviation generated in the corresponding display region AA, and the plurality of wire grids 12 may be formed in each of the several regions and the plurality of wire grids 12 in each region may have different characteristics (e.g., a different spacing, a different width, and/or a different pitch).

Also, the brightness of the organic light-emitting display apparatus (see 100 of FIG. 5) may gradually increase from the central part (see B2 of FIG. 5) to the outer part (see B1 of FIG. 5) (e.g., a brightness gradient may exist from the central part towards the outer part of the organic light-emitting display apparatus). As a result, the spacing between each of the plurality of wire grids 12 may increase (e.g., be formed to gradually increase or to correspond to the brightness gradient) from the second region A2 to the first region A1 (e.g., along a direction from the second region A2 toward the first region A1).

In the foregoing description, it has been described that the different spacing between each pair of the plurality of wire grids 12 formed in the first region A1 and between each pair of the plurality of wire grids 12 formed in the second region A2 of the wire grid polarizer 10 are formed by adjusting the pitch P of the wire grids 12. However, the present invention is not limited thereto. The different spacing between the plurality of wire grids 12 formed in the first region A1 and the plurality of wire grids 12 formed in the second region A2 of the wire grid polarizer 10 may be formed by adjusting the width W of the individual wire grids 12.

For example, the width W of one of the plurality of wire grids 12 may be about 100 nm or less. Because a width of each of the plurality of wire grids 12 disposed in the first region A1 is formed to be narrower than a width of each of the plurality of wire grids 12 disposed in the second region A2, the first spacing between each pair of the plurality of wire grids 12 disposed in the first region A1 may be formed to be greater than the second spacing between each pair of the plurality of wire grids 12 disposed in the second region A2. Therefore, the brightness deviation from the central part (see B2 of FIG. 5) to the outer part (see B1 of FIG. 5) of the organic light-emitting display apparatus (see 100 of FIG. 5) may be reduced.

Moreover, an anti-reflective layer may be further formed on a surface of each of the plurality of wire grids 12. Herein, the surface of the wire grids 12 denotes a side on which external light is incident (e.g., an outer side). The anti-reflective layer may improve the bright room contrast and visibility of the organic light-emitting display apparatus (see 100 of FIG. 5) by preventing the reflection of the external light from the wire grids 12.

For example, in a case where the external light is incident on a side on which the wire grids 12 are formed, the anti-reflective layer is formed to cover the surface, i.e., a top, of the wire grid 12, and thus, the reflection of the external light from the wire grids 12 formed of the conductive material may be reduced or prevented.

As another example, in a case where the wire grid polarizer 10 is disposed such that the wire grids 12 face the organic light-emitting display apparatus (see 100 of FIG. 5), the anti-reflective layer is formed on another surface, i.e., between the wire grid 12 and the base substrate 11 when the external light is incident on a side on which the wire grids 12 are not formed, and thus, the reflection of the external light from a bottom of the wire grid 12 may be reduced or prevented.

The anti-reflective layer may be formed to include a dielectric material. Various suitable dielectric materials including organic materials or inorganic materials may be used, and for example, the dielectric material may be an inorganic material, such as silicon oxide ($SiO_x$ ($x \geq 1$)), silicon nitride ($SiN_x$ ($x \geq 1$)), magnesium fluoride ($MgF_2$), calcium fluoride ($CaF_2$), aluminum oxide ($Al_2O_3$), tin dioxide ($SnO_2$), indium tin oxide (ITO), indium zinc oxide (IZO), zinc oxide (ZnO), and/or indium oxide ($In_2O_3$); or be an organic material, such as a polymer.

Also, the anti-reflective layer may further include a metal. The metal may be a material, such as iron (Fe), cobalt (Co), vanadium (V), titanium (Ti), aluminum (Al), silver (Ag), silicon (Si), chromium (Cr), molybdenum (Mo), germanium (Ge), yttrium (Y), zinc (Zn), zirconium (Zr), tungsten (W), tantalum (Ta), copper (Cu), and platinum (Pt). When the anti-reflective layer is formed of a mixture of the metal and the dielectric material, a reflectance of the anti-reflective layer may be decreased and an absorption coefficient thereof may be increased.

Figure 5:
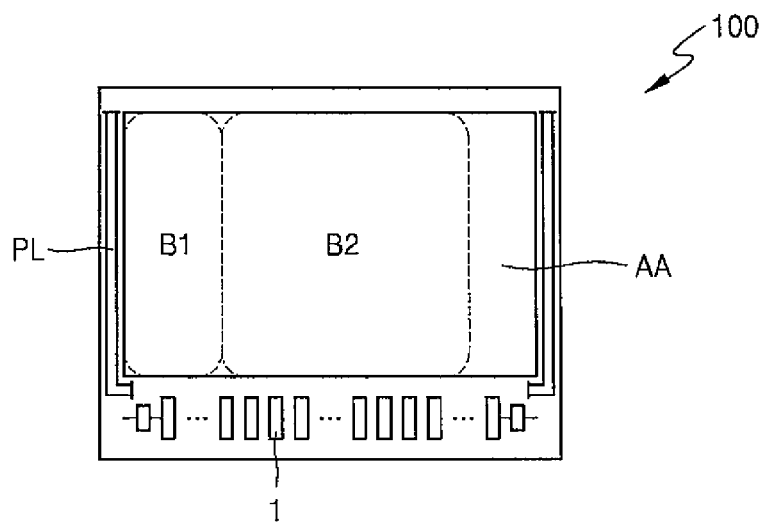
FIG. 5 is a plan view schematically illustrating an organic light-emitting display panel according to an embodiment of the present invention.
Figure 6:
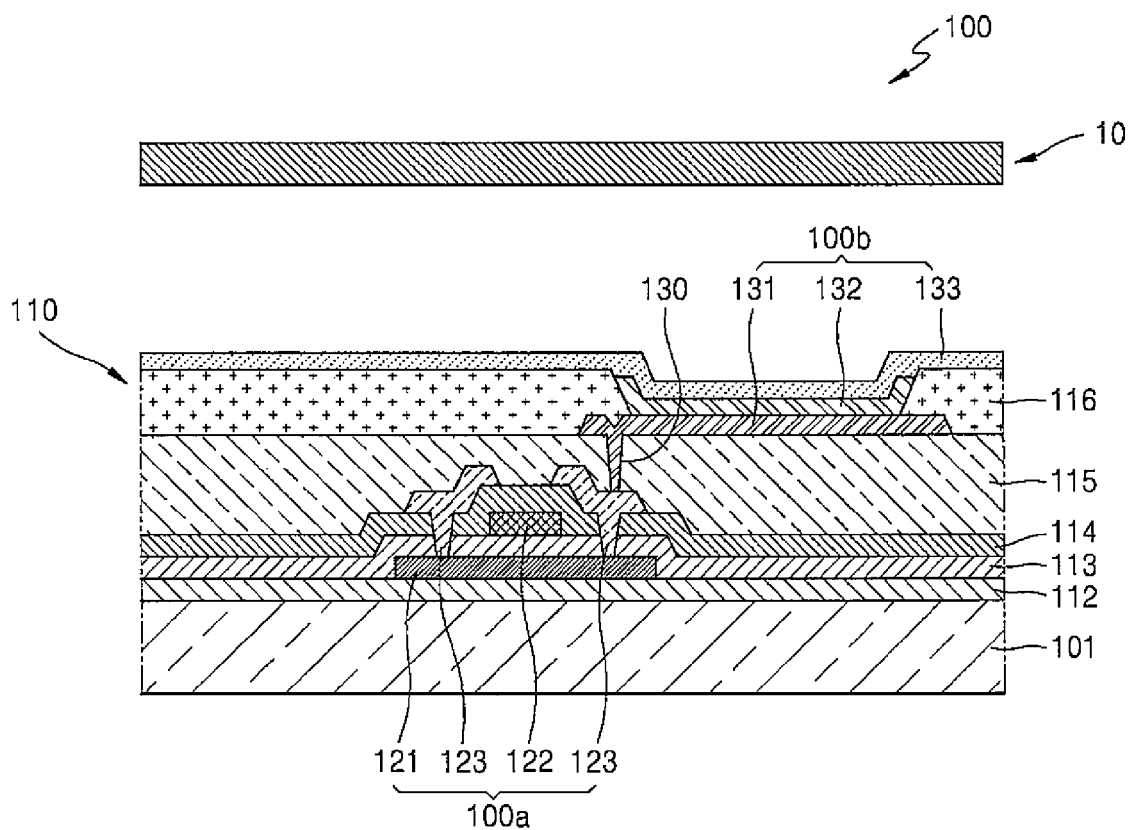
FIG. 6 is a cross-sectional view schematically illustrating a cross section of a display region of the organic light-emitting display panel shown in FIG. 5.

FIG. 5 is a plan view schematically illustrating an organic light-emitting display panel of the organic light-emitting display apparatus 100, according to an embodiment of the present invention, and FIG. 6 is a cross-sectional view schematically illustrating a cross section of a display region of the organic light-emitting display panel shown in FIG. 5.

Referring to FIGS. 5 and 6, the organic light-emitting display apparatus 100 according to the embodiment of the present invention may include a display unit 110 generating an image and a wire grid polarizer 10 disposed over (e.g., on) the display unit 110.

The display unit 110 includes a display region AA displaying an image. A pad unit 1 may transmit electrical signals from a signal generating apparatus to the display region AA and may be disposed around the display region AA.

The display unit 110 may include a substrate 101, a thin-film transistor (TFT) 100a formed on the substrate 101, and an organic light-emitting device 100b.

The substrate 101 may be formed of a transparent glass material including silicon dioxide ($SiO_2$) as a main component. However, the substrate 101 is not necessarily limited thereto and may be formed of a transparent plastic material. The transparent plastic material forming the substrate 101 may be an insulating organic material in which the plastic material may be an organic material selected from the group consisting of polyethersulfone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose triacetate (TAC), and cellulose acetate propionate (CAP).

In a case where the organic light-emitting display apparatus 100 is a bottom-emission display apparatus, in which an image is emitted (e.g., formed) in a direction toward the substrate 101, the substrate 101 must be formed of a transparent material. However, in a case where the organic light-emitting display apparatus 100 is a top-emission display apparatus, in which an image is emitted (e.g., formed) in a direction opposite to the substrate 101, the substrate 101 is not necessarily formed of a transparent material. In this case, the substrate 101 may be formed of a metal. In the case where the substrate 101 is formed of a metal, the substrate 101 may include one or more selected from the group consisting of carbon (C), iron (Fe), chromium (Cr), manganese (Mn), nickel (Ni), titanium (Ti), molybdenum (Mo), and stainless steel (SUS). However, the present invention is not limited thereto.

A buffer layer 112 may be formed on the substrate 101. The buffer layer 112 may prevent the penetration of impurity elements into the substrate 101 and may provide a flat surface on the substrate 101. The buffer layer 112 may be formed of various suitable materials that may perform the above functions. For example, the buffer layer 112 may include an inorganic material, such as silicon oxide, silicon nitride, silicon oxynitride, aluminium oxide, aluminium nitride, titanium oxide, or titanium nitride, and/or an organic material, such as a polyimide, a polyester, or an acrylate. In addition, the buffer layer 112 may be formed of one or more layers (e.g., stacks).

The buffer layer 112 may be formed by (e.g., deposited by) various deposition methods, such as plasma-enhanced chemical vapour deposition (PECVD), atmospheric pressure CVD (APCVD), or low pressure CVD (LPCVD).

The TFT 100a may include an active layer 121, a gate electrode 122, and source and drain electrodes 123.

The active layer 121 may be formed of an inorganic semiconductor, such as silicon, or an organic semiconductor on the buffer layer 112. Also, the active layer 121 may include a source region, a drain region, and a channel region therebetween. For example, in a case where the active layer 121 is formed using amorphous silicon, an amorphous silicon layer is formed on an entire surface of the substrate 101, and the amorphous silicon layer is then crystallized to form a polycrystalline silicon layer. Thereafter, the polycrystalline silicon layer is patterned, and the active layer 121, including the source region, the drain region, and the channel region therebetween, may then be formed by doping the edges of the source region and the drain region with impurities.

A gate dielectric layer 113 is formed on the active layer 121. The gate dielectric layer 113 insulates the gate electrode 122 from the active layer 121. The gate dielectric layer 113 may be formed of an inorganic material, such as silicon nitride ($SiN_x$) ($x \geq 1$) or silicon dioxide ($SiO_2$).

The gate electrode 122 is formed at a region (e.g., a predetermined region) of the gate dielectric layer 113. The gate electrode 122 is connected to a gate line via which on/off signals are applied to the TFT 100a.

The gate electrode 122 may include gold (Au), silver (Ag), copper (Cu), nickel (Ni), platinum (Pt), palladium (Pd), aluminum (Al), and/or molybdenum (Mo), and/or may also include an alloy, such as an aluminum-neodymium (Al—Nd) alloy or a molybdenum-tungsten (Mo—W) alloy. However, the gate electrode 122 is not limited thereto, and may be formed of various materials in consideration of design conditions.

An interlayer dielectric 114 is formed on the gate electrode 122 to insulate the gate electrode 122 from the source and drain electrodes 123. The interlayer dielectric 114 may be formed of an inorganic material, such as silicon nitride ($SiN_x$) ($x \geq 1$) or silicon dioxide ($SiO_2$).

The source and drain electrodes 123 may be formed on the interlayer dielectric 114. Specifically, the interlayer dielectric 114 and the gate dielectric layer 113 expose the source region and the drain region of the active layer 121, and the source and drain electrodes 123 contact the exposed source region and drain region of the active layer 121, respectively.

Although FIG. 6 exemplifies a top-gate TFT sequentially including the active layer 121, the gate electrode 122, and the source and drain electrodes 123, the present invention is not limited thereto, and the gate electrode 122 may be disposed under the active layer 121.

The TFT 100a drives the organic light-emitting device 100b by being electrically connected thereto. The organic light-emitting device 100b may include a pixel electrode 131, an intermediate layer 132, and a counter electrode 133.

A planarization layer 115 is formed over (e.g., on) the TFT 100a, a through hole 130 is formed in (e.g., through) the planarization layer 115, and the source and drain electrodes 123 and the pixel electrode 131 are electrically connected via the through hole 130.

An inorganic insulating layer and/or an organic insulating layer may be used as the planarization layer 115. The inorganic insulating layer may include silicon dioxide ($SiO_2$), silicon nitride ($SiN_x$) (x≥1), silicon oxynitride (SiON), aluminium oxide ($Al_2O_3$), titanium dioxide ($TiO_2$), tantalum pentoxide ($Ta_2O_5$), hafnium oxide ($HfO_2$), zirconium dioxide ($ZrO_2$), barium strontium titanate (BST), and/or lead zirconium titanate (PZT), and the organic insulating layer may include a general purpose polymer (e.g., poly (methyl methacrylate) (PMMA), or polystyrene (PS)), a polymer derivative having a phenol group, an acrylate-based polymer, an imide-based polymer, an aryl ether-based polymer, an amide-based polymer, a fluorine-based polymer, a p-xylene-based polymer, a vinyl alcohol-based polymer, and/or a blend thereof. Also, the planarization layer 115 may be formed as a composite stack of the inorganic insulating layer and the organic insulating layer.

The pixel electrode 131 may be a reflective electrode. The pixel electrode 131 may include a reflective layer formed of silver (Ag), magnesium (Mg), aluminium (Al), platinum (Pt), palladium (Pd), gold (Au), nickel (Ni), neodymium (Nd), iridium (Ir), chromium (Cr), and/or a compound thereof, and a transparent or translucent electrode layer formed on the reflective layer. The transparent or translucent electrode layer may include at least one or more selected from the group consisting of indium tin oxide (ITO), indium zinc oxide (IZO), zinc oxide (ZnO), indium oxide ($In_2O_3$), indium gallium oxide (IGO), and aluminium zinc oxide (AZO).

The counter electrode 133 disposed to at least correspond to (e.g., face) the pixel electrode 131 may be a transparent or translucent electrode, and may be formed as a thin film of a metal with a low work function including lithium (Li), calcium (Ca), lithium fluoride/calcium (LiF/Ca), lithium fluoride/aluminium (LiF/Al), aluminium (Al), silver (Ag), magnesium (Mg), and/or a compound thereof. Also, an auxiliary electrode layer or a bus electrode may be further formed of a material for forming a transparent electrode, such as ITO, IZO, ZnO, or $In_2O_3$, on the metal thin film.

Therefore, the counter electrode 133 may transmit light emitted from an organic emission layer included in the intermediate layer 132. That is, the light emitted from the organic emission layer may be emitted toward the counter electrode 133 by being reflected or directly reflected by the pixel electrode 131 composed of the reflective electrode.

However, the organic light-emitting display apparatus 100 of the present embodiment is not limited to a top-emission display apparatus, and may be a bottom-emission display apparatus in which the light emitted from the organic emission layer is emitted toward the substrate 101. In this case, the pixel electrode 131 may be composed of a transparent or translucent electrode, and the counter electrode 133 may be composed of a reflective electrode. Also, the organic light-emitting display apparatus 100 of the present embodiment may be a dual-emission display apparatus in which light is emitted in both top and bottom directions.

A pixel-defining layer 116 is formed of an insulating material on the pixel electrode 131. The pixel-defining layer 116 may be formed of one or more organic insulating materials selected from the group consisting of a polyimide, a polyamide, an acrylate resin, benzocyclobutane, and a phenol resin by using a method such as spin coating. The pixel-defining layer 116 exposes a region (e.g., a predetermined region) of the pixel electrode 131, and the intermediate layer 132, including the organic emission layer, is disposed on the exposed region of the pixel electrode 131.

The organic emission layer included in the intermediate layer 132 may be a low molecular weight organic material or a polymer organic material. The intermediate layer 132 may further include one or more functional layers, such as a hole transport layer (HTL), a hole injection layer (HIL), an electron transport layer (ETL), and an electron injection layer (EIL), in addition to the organic emission layer (not shown).

An encapsulation member sealing the organic light-emitting device 100b may be formed over (e.g., formed on or directly on) the organic light-emitting device 100b. The encapsulation member is formed to protect the organic light-emitting device 100b from outside moisture or oxygen, and may be a glass substrate, a plastic substrate, or an overlapping structure of a plurality of organic and inorganic materials.

Also, the organic light-emitting device 100b includes the wire grid polarizer 10. The wire grid polarizer 10 may transmit only specific polarized light among light generated by (e.g., from) the organic light-emitting device 100b.

The wire grid polarizer 10 includes the base substrate (see 11 of FIG. 2) and the plurality of wire grids (see 12 of FIG. 2), and the first spacing between each pair of the wire grids 12 disposed in the first region A1 of the base substrate (see 11 of FIG. 2) and the second spacing between each pair of the wire grids 12 disposed in the second region A2 of the base substrate 11 may be different (e.g., differently formed). Because the wire grid polarizer 10 is the same as illustrated and described in FIGS. 1 to 4, a detailed description thereof is omitted.

The display unit 110 may include a plurality of interconnections that supply a drive signal or power to the TFT 100a or the organic light-emitting device 100b.

The interconnections may be a data line and a scan line respectively connected to a data driver and a scan driver that respectively generate a data signal and a scan signal, or may be an ELVDD line or ELVSS fine for supplying power.

The plurality of interconnections may be formed across the display region AA, and may be parallel to (e.g., may extend parallel to) the wire grids 12 according to the arrangement of the wire grid polarizer 10. In a case where the wire grids 12 and the interconnections in the display unit 110 overlap, a Moiré phenomenon may occur. Therefore, the wire grids 12 may be formed not to overlap with the interconnections.

Also, a power supply line PL, such as the ELVDD line and the ELVSS line, may be disposed at an edge of the display region AA, in which an outer part B1 of the display region AA nearer to the interconnections may have higher brightness than a central part 82.

The wire grid polarizer 10 includes a first region (see A1 of FIG. 1) corresponding to the outer part B1 of the display region AA and a second region (see A2 of FIG. 1) corresponding to the central part B2 of the display region AA, and the brightness deviation (e.g., brightness gradient) of the display region AA may be reduced by forming the first spacing between each pair of the plurality of wire grids (see 12 of FIG. 1) formed in the first region (see A1 of FIG. 1) to be greater than the second spacing between each pair of the plurality of wire grids (see 12 of FIG. 1) formed in the second region (see A2 of FIG. 1).

For example, when the widths (see W of FIG. 2) of all of the wire grids 12 are the same, a straight light efficiency of the wire grid polarizer 10 in the second region (see A2 of FIG. 1) may be improved and a brightness difference between the outer part B1 and the central part B2 of the display region AA may be reduced by forming the first pitch of the wire grids (see 12 of FIG. 1) formed in the first region (see A1 of FIG. 1) to be about 200 nm and the second pitch of the wire grids (see 12 of FIG. 1) formed in the second region (see A2 of FIG. 1) to be about 150 nm.

Figure 7:
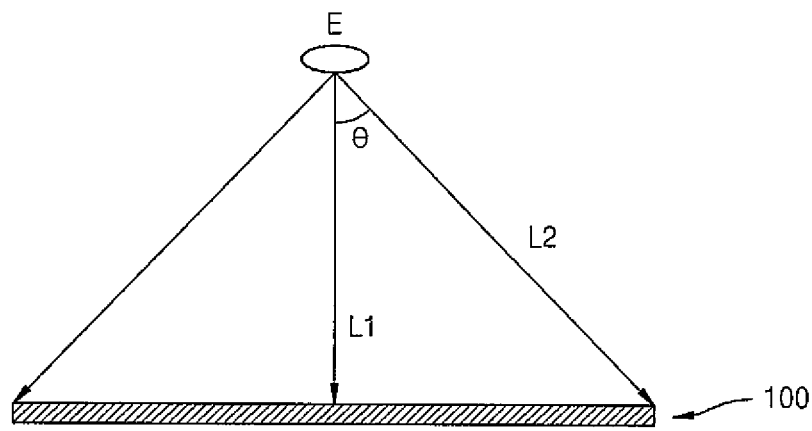
FIG. 7 schematically illustrates a color change phenomenon of the organic light-emitting display panel shown in FIG. 5 according to viewing angle.
Figure 7:
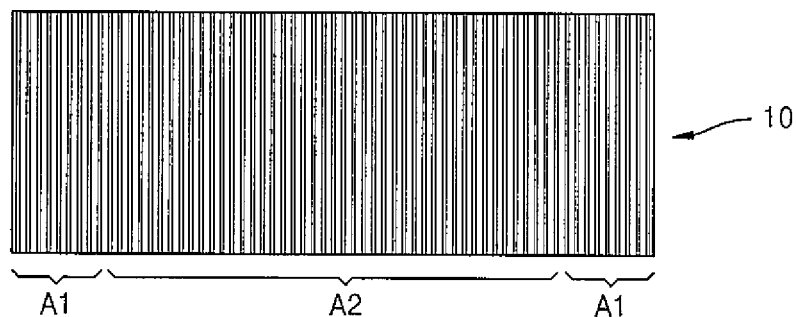
Figure 7:
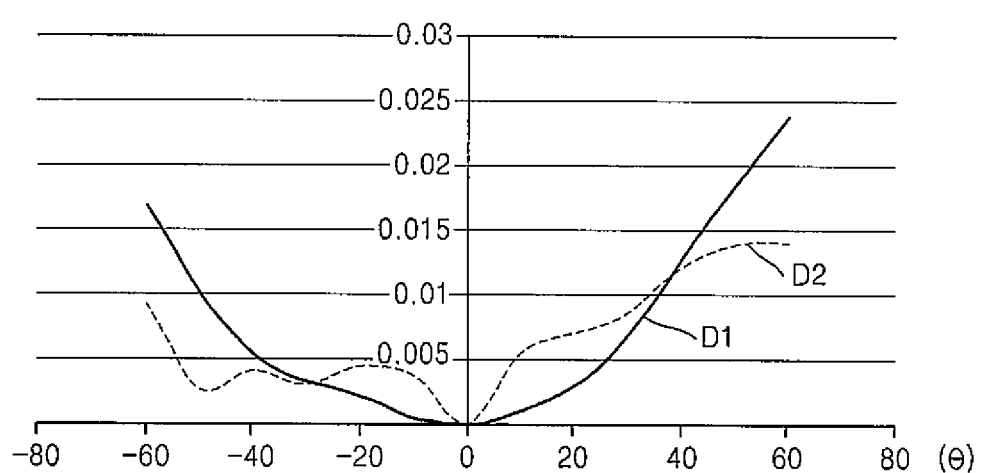

FIG. 7 schematically illustrates a color change phenomenon [white angle difference (WAD)] of the organic light-emitting display panel shown in FIG. 5 according to viewing angle.

Referring to FIG. 7, for example, when an observer E is located along the center of the organic light-emitting display apparatus 100, the shortest distance from the observer E to the organic light-emitting display apparatus 100 is L1. In contrast, because a distance from the observer E to an edge of the organic light-emitting display apparatus 100 is L2, the color change phenomenon, WAD, may occur, in which a color displayed at the edge of the organic light-emitting display appears (e.g., is recognized as) different from the color displayed at the center of the organic light-emitting display when the observer E views the edge of the organic light-emitting display apparatus 100.

The color change phenomenon varies (e.g., is changed) according to a viewing angle θ, wherein the color change phenomenon increases as the viewing angle θ increases and the brightness of the organic light-emitting display apparatus 100 increases.

The organic light-emitting display apparatus 100 includes a wire grid polarizer 10. The wire grid polarizer 10 includes a plurality of wire grids (see 12 of FIG. 2), and a first spacing between each pair of the wire grids 12 disposed in a first region A1 of the base substrate 11 and a second spacing between each pair of the wire grids 12 disposed in a second region A2 of the base substrate 11 may be different.

For example, the first region A1 may be disposed outside the second region A2 (e.g., the first region A1 may be disposed outside the second region A2 along a width direction of the organic light-emitting display apparatus 100), and the first spacing may be formed to be larger than the second spacing. As described in FIG. 4, because the optical efficiency of the wire grid polarizer 10 may be improved as the spacing between the wire grids (see 12 of FIG. 2) decreases, the brightness at the edge of the organic light-emitting display apparatus 100 may decrease when the spacing between the wire grids (see 12 of FIG. 2) in the first region A1, corresponding to the edge of the organic light-emitting display apparatus 100, is formed to be relatively wide, and thus, the color change phenomenon according to the viewing angle θ may be reduced.

D1 of FIG. 7 illustrates the color change phenomenon in a case where the wire grid polarizer 10 is not included, and D2 illustrates the color change phenomenon in a case where the wire grid polarizer 10 according to the embodiment of the present invention is included.

The wire grid polarizer 10 is formed to have a first pitch of about 200 nm in the first region A1 and a second pitch of about 150 nm in the second region A2. As a result, it may be realized that the color change phenomenon of the organic light-emitting display apparatus 100 is reduced.

Also, because the straight light efficiency of the wire grid polarizer 10 in the second region (see A2 of FIG. 1) may be improved when the wire grid polarizer 10 is included, the brightness difference between the outer part (see B1 of FIG. 5) and the central part (see B2 of FIG. 5) of the display region (see AA of FIG. 5) may be reduced. Therefore, the brightness uniformity of the organic light-emitting display apparatus 100 may be improved.

As described above, a wire grid polarizer may improve the uniformity of brightness of an organic light-emitting display apparatus and may reduce a color change phenomenon according to viewing angle.

In addition, other aspects and/or characteristics of the present invention may also be deduced from the above descriptions with reference to the accompanying drawings.

Sizes of elements in the drawings may be exaggerated for convenience of explanation. In other words, because sizes and thicknesses of components in the drawings are arbitrarily illustrated for convenience of explanation, the present invention is not limited thereto.

It should be understood that the exemplary embodiments described herein should be considered in a descriptive sense only and not for purposes of limitation. Descriptions of features, aspects, or characteristics within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. A wire grid polarizer comprising:
   a base substrate having a length and a width; and
   a plurality of wire grids on the base substrate, extending in the length direction, and having a same length as the base substrate,
   wherein the plurality of wire grids are spaced from one another and arranged in parallel along the width direction, and a first spacing between each pair of the plurality of wire grids at a first region of the base substrate and a second spacing between each pair of the plurality of wire grids at a second region of the base substrate are different,
   wherein the length of the first region is the same as the length of the second region,
   wherein an area of the first region of the base substrate is different than an area of the second region of the base substrate, and
   wherein the first region of the base substrate is at opposite sides of the second region of the base substrate.

2. The wire grid polarizer of claim 1, wherein the first spacing is larger than the second spacing.

3. The wire grid polarizer of claim 2, wherein all of the plurality of wire grids have a same width, and a first pitch of the plurality of wire grids at the first region is larger than a second pitch of the plurality of wire grids at the second region.

4. The wire grid polarizer of claim 2, wherein all of the plurality of wire grids have a same pitch, and a width of each of the plurality of wire grids at the first region is smaller than a width of each of the plurality of wire grids at the second region.

5. The wire grid polarizer of claim 2, wherein a spacing between the plurality of wire grids increases along a direction from the second region to the first region.

6. The wire grid polarizer of claim 1, wherein an anti-reflective layer is formed on a surface of each of the plurality of wire grids.

7. The wire grid polarizer of claim 6, wherein the surface is a side on which external light is incident.

8. The wire grid polarizer of claim 6, wherein the anti-reflective layer comprises a dielectric material and a metal.

9. An organic light-emitting display apparatus comprising:
a display unit configured to generate an image; and
a wire grid polarizer on the display unit,
wherein the wire grid polarizer comprises:
   a base substrate; and
   a plurality of wire grids on the base substrate and having a same length as the base substrate,
   wherein the plurality of wire grids are spaced from one another and arranged in parallel, and a first spacing between each pair of the plurality of wire grids at first regions of the base substrate and a second spacing between each pair of the plurality of wire grids at second regions of the base substrate are different,
   wherein an area of each of the first regions of the base substrate is different than an area of the second regions of the base substrate, and
   wherein ones of the first regions of the base substrate are spaced from each other and are at opposite sides of the second region of the base substrate.

10. The organic light-emitting display apparatus of claim 9, wherein the display unit comprises an organic light-emitting device configured to generate the image and a power supply line to supply power to the organic light-emitting device,
wherein the power supply line is nearer to the first region than the second region.

11. The organic light-emitting display apparatus of claim 10, wherein the display unit further comprises a transistor configured to apply an electrical signal to the organic light-emitting device.

12. The organic light-emitting display apparatus of claim 10 wherein the display unit is configured to display a higher brightness at a portion of the display unit corresponding to the first regions than at a portion of the display unit corresponding to the second regions.

13. The organic light-emitting display apparatus of claim 12, wherein the first spacing is larger than the second spacing.

14. The organic light-emitting display apparatus of claim 12, wherein all of the plurality of wire grids have a same width, and a first pitch of the plurality of wire grids at the first regions is larger than a second pitch of the plurality of wire grids at the second regions.

15. The organic light-emitting display apparatus of claim 12, wherein all of the plurality of wire grids have a same pitch, and a width of each of the plurality of wire grids at the first regions is smaller than a width of each of the plurality of wire grids at the second regions.

16. The organic light-emitting display apparatus of claim 12, wherein a spacing between the plurality of wire grids increases along a direction from the second regions to one of the first regions.

17. The organic light-emitting display apparatus of claim 9, wherein an anti-reflective layer is formed on a surface of each of the plurality of wire grids.

18. The organic light-emitting display apparatus of claim 17, wherein the surface is a side on which external light is incident.

19. The organic light-emitting display apparatus of claim 17, wherein the anti-reflective layer comprises a dielectric material and a metal.

\* \* \* \* \*